United States Patent
Krzyzkowski

[19]
[11] Patent Number: 6,131,168
[45] Date of Patent: Oct. 10, 2000

[54] SYSTEM AND METHOD FOR REDUCING PHASE ERROR IN CLOCKS PRODUCED BY A DELAY LOCKED LOOP

[75] Inventor: Richard A. Krzyzkowski, Ft. Collins, Colo.

[73] Assignee: Agilent Technologies, Palo Alto, Calif.

[21] Appl. No.: 09/271,551

[22] Filed: Mar. 18, 1999

[51] Int. Cl.$^7$ .................................. G06F 1/04; H03L 7/06
[52] U.S. Cl. ......................... 713/503; 327/158; 375/376
[58] Field of Search ................................... 713/401, 500, 713/503; 375/371, 373, 376; 327/156, 158, 161

[56] References Cited

U.S. PATENT DOCUMENTS

| | | | |
|---|---|---|---|
| 5,832,021 | 11/1998 | Kondo | 375/200 |
| 5,999,576 | 12/1999 | Lee | 375/333 |
| 6,011,822 | 1/2000 | Dreyer | 375/376 |
| 6,037,812 | 3/2000 | Gaudet | 327/116 |
| 6,055,287 | 4/2000 | McEwan | 375/376 |

*Primary Examiner*—Thomas M. Heckler

[57] ABSTRACT

A circuit and method for reducing error in a delay locked loop (DLL) in which a plurality of outputs, each establishing a boundary between two consecutive phases, is accomplished by averaging an error present in one of the outputs over at least two phases established by the outputs. A pair of inverters are used to drive fight during a definable time period, which enables the circuitry to average the error over at least two phases, thus distributing the error that was present in one phase over at least two phases.

19 Claims, 8 Drawing Sheets

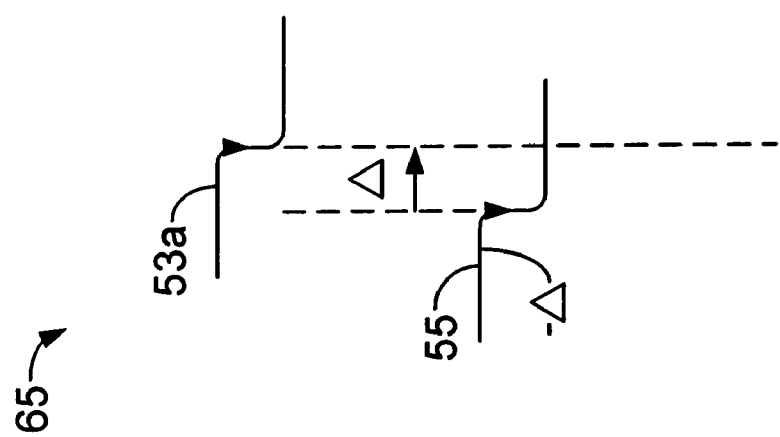

SYSTEM AND METHOD FOR REDUCING PHASE ERROR IN CLOCKS PRODUCED BY A DELAY LOCKED LOOP

TECHNICAL FIELD

The present invention relates generally to clocking architecture, and, more particularly, to a system and method for reducing phase error in clock signals produced by a delay locked loop.

BACKGROUND OF THE INVENTION

In many integrated circuit packages, it is desirable to provide a system, or reference clock signal. The reference clock signal is used by many devices to derive their respective timing. For example, a reference clock signal may be provided to memory devices, processors, or other circuitry located on a chip. Oftentimes it is desirable to delay the reference clock signal in a manner that creates multiple iterations of the clock signal. These multiple iterations of the reference clock are separated by a known period of time, or phase. For example, a known way of creating multiple iterations of a reference clock is to supply the reference clock to a delay locked loop (DLL). A DLL, as known in the art, is a device that takes the reference clock signal and passes the signal through one or multiple delay lines connected in series. With multiple delay lines connected in series, each delay line supplies a subsequent delay line, such that multiple iterations of the reference clock signal appear at different times. Each of these different times represents a boundary between two consecutive phases. One possible DLL configuration will take a reference clock signal input and create a quadrature output in which there are four iterations of the reference clock signal each iteration being separated by 90 degrees.

A problem, however, with DLL's is that any error in any signal, be it either the reference clock signal or any of the output signals, present will manifest in one, or more, of the output signals, resulting in, for the case of the above described quadrature output signals, one or more phases being shortened or lengthened by an amount equal to the error introduced.

Therefore, it would be desirable to minimize the error present in the DLL output.

SUMMARY OF THE INVETION

The invention provides a system and method for reducing phase error in a delay locked loop.

In architecture, the present invention may be conceptualized as a system for clocking in an integrated circuit, comprising: a delay locked loop (DLL) having a plurality of delay lines, each delay line having an output, each output establishing a boundary between two consecutive phases; a reference signal supplying an input to the DLL, the reference signal being substantially equal to at least one of the plurality of delay line outputs; and buffer circuitry, having a plurality of inputs corresponding to the plurality of delay line outputs, the buffer circuitry also having a plurality of outputs, each output establishing the boundary between two consecutive phases, the buffer circuitry configured to combine at least one of the plurality of delay line outputs with the reference signal such that error is averaged across at least two of the phases established by the plurality of buffer circuitry outputs.

The present invention may also be conceptualized as providing a method for clocking in a delay locked loop (DLL), the DLL including a plurality of delay lines, each delay line having an output, each output establishing a boundary between two consecutive phases, the method comprising the steps of: receiving in the DLL a reference signal; supplying each of the plurality of delay line outputs to a corresponding input of buffering circuitry, the buffering circuitry also having a plurality of outputs, each output establishing the boundary between two consecutive phases; and combining in the buffering circuitry the reference signal and at least one of the plurality of delay line outputs, whereby error is averaged over at least two of the phases established by the buffering circuitry outputs.

The invention has numerous advantages, a few of which are delineated, hereafter, as merely examples.

An advantage of the invention is that it reduces the amount of phase error in a delay locked loop.

An advantage of the invention is that it compensates for error present in an external reference clock provided to an integrated circuit device.

Another advantage of the invention is that it improves the performance of on-chip clocking systems.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

FIG. 3B is a graphical representation of the reference clock signal as passed through a delay line FIG. 2, in which error is present in the form of a negative jitter;

DETAILED DESCRIPTION OF THE INVENTION

The invention to be described hereafter is applicable to on-chip clocking systems, however, the invention can be employed in any system in which multiple clock signals are generated by a DLL. Furthermore, for simplicity in the description to follow, only the principal elements of the delay locked loop of the present invention will be illustrated.

Figure 1:
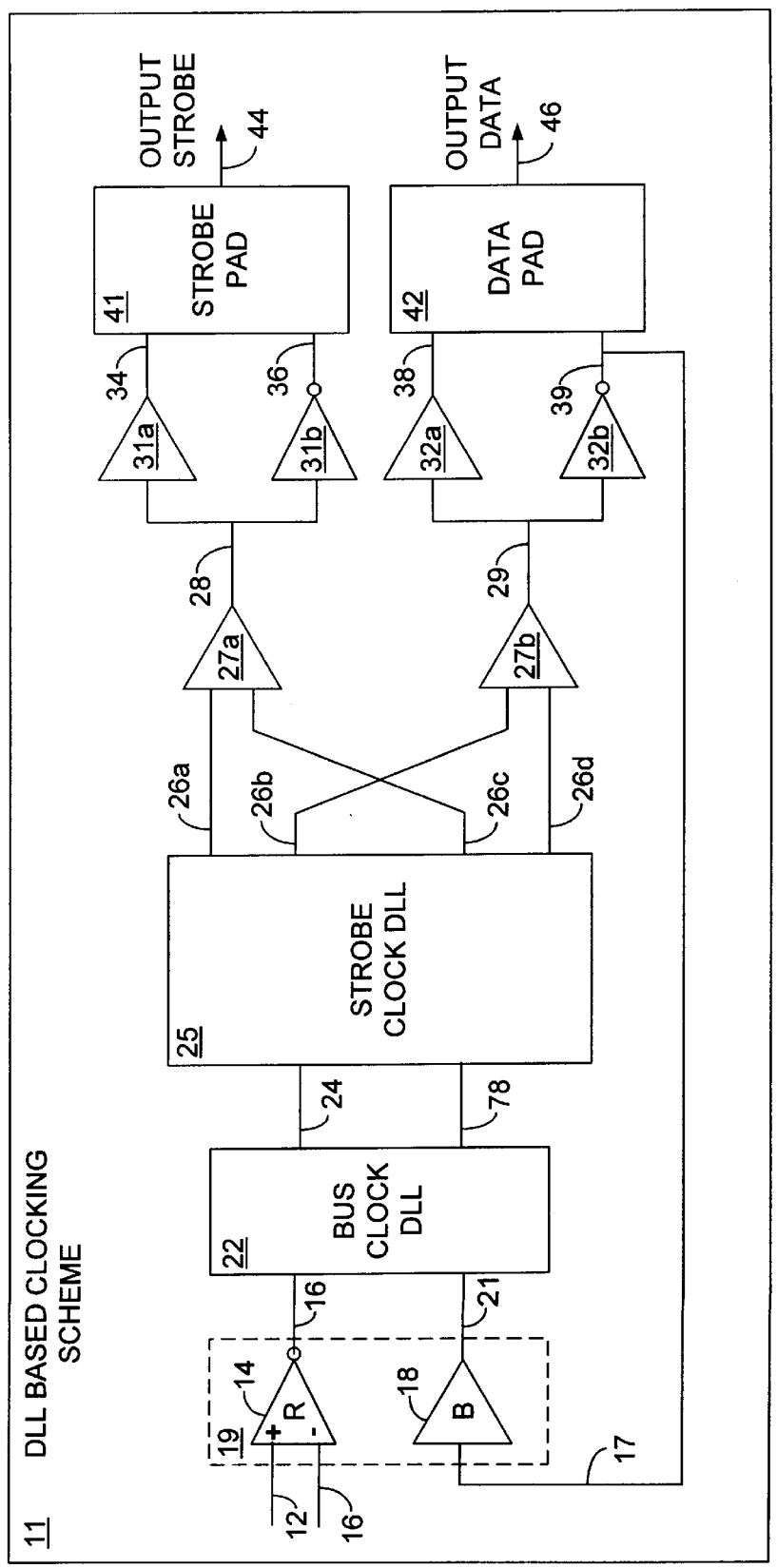
FIG. 1 is a block diagram illustrating a DLL based clocking scheme including the strobe clock DLL which includes the edge averaging circuit of the present invention.

Turning now to the drawings, FIG. 1 is a block diagram illustrating a DLL based clocking scheme including the strobe clock DLL 25 which includes the edge averaging circuit of the present invention. A system clock signal is supplied to clock receiver pad 19 over connections 12 and 16. A positive version of the system clock is supplied to receiver 14 over connection 12 and a negative version of the system clock signal is supplied to receiver 14 over connection 16. A feedback signal comprising the signal "bus clock 2" is supplied over connection 17 to buffer 18. Clock receiver pad 19 supplies over connections 16 and 21 clock signals to bus clock DLL 22. Bus clock DLL 22 supplies a reference clock signal over connection 24 and an early version of the reference clock signal over connection 78 to strobe clock DLL 25. Although not shown in FIG. 1, strobe clock DLL 25 includes a plurality of delay lines and the edge averaging circuit of the present invention, and will be described in further detail with respect to FIGS. 2–7. Strobe clock DLL 25 supplies quadrature outputs 26a, 26b, 26c, and 26d, respectively, to main drivers 27a and 27b. Although shown as having quadrature outputs 26a–26d, strobe clock DLL 25 may provide greater or fewer outputs depending on application. Furthermore, while the present invention will be described herein with respect to quadrature DLL outputs, other output schemes providing greater or fewer outputs may benefit from the concepts of the present invention. Main driver 27a supplies over connection 28 the system clock signal to local buffers 31a and 31b and main driver 27b supplies the system clock signal over connection 29 to local buffers 32a and 32b. Local buffer 31a supplies a signal known as "strobe clock 1" over connection 34 to strobe pad 41 and local buffer 31b supplies an inverted version of strobe clock 1 in the form of a signal called "strobe clock 2" over connection 36 to strobe pad 41. Similarly, local buffer 32a supplies a system clock signal called "bus clock 1" over connection 38 to data pad 42 while local buffer 32b supplies an inverted version of that signal called "bus clock 2" over connection 39 to data pad 42. Strobe pad 41 provides an output strobe signal over connection 44 to other components of the system and data pad 42 provides a data output signal over connection 46 to other components of the system. These other components include system devices which receive source-synchronous data from the device on which DLL based clocking scheme 11 resides.

Figure 2:
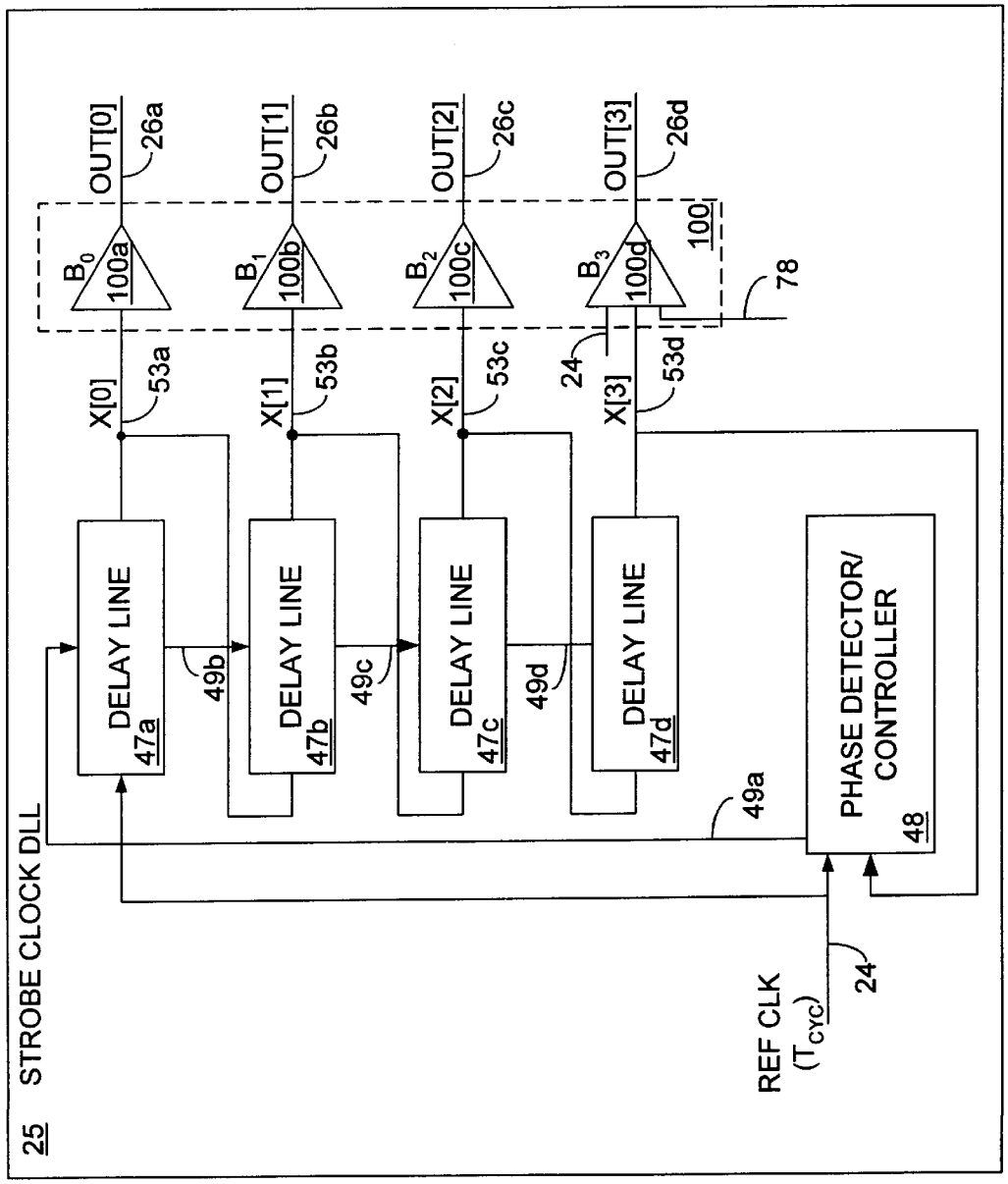
FIG. 2 is a block diagram illustrating the strobe clock DLL of FIG. 1 including the edge averaging circuitry of the present invention.

FIG. 2 is a block diagram illustrating the strobe clock DLL 25 of FIG. 1 including the edge averaging circuitry 100 of the present invention. Strobe clock DLL 25 receives reference clock input signal over connection 24 into phase detector/controller 48. Strobe clock DLL 25 also includes a plurality of delay lines. Delay lines, as known in the art, receive an input and supply that input as an output delayed over a given period of time. In the embodiment disclosed in FIG. 2, strobe clock DLL 25 includes four delay lines 47a, 47b, 47c and 47d, which generate the quadrature clock outputs used in this particular embodiment. It should be noted that any number of delay lines may be included within strobe clock DLL 25 depending on the number of outputs desired. Phase detector/controller 48 supplies delay control signals over connection 49a to delay line 47a. Delay line 47a then forwards the delay control signals over connection 49b to delay line 47b. The output, 53a, of delay line 47a is also supplied to delay line 47b. Similarly, delay line 47b forwards over connection 49c the delay control signals to delay line 47c. The output, 53b, of delay line 47b is also supplied to delay line 47c. Delay line 47c forwards the delay control signals over connection 49d to delay line 47d, which also receives as input the output 53c, of delay line 47c. Delay line 47a also receives the reference clock signal over connection 24. In this manner, the reference clock signal supplied on connection 24 to delay line 47a and to phase detector/controller 48 is delayed such that quadrature outputs are formed. In this embodiment, quadrature outputs X[0], X[1], X[2] and X[3] are provided by delay lines 47a, 47b, 47c and 47d, respectively, on connections 53a, 53b, 53c and 53d, respectively. It should be noted that the output of each delay line represents a boundary between two consecutive phases. The reference clock signal 24 is also supplied to buffer 100d as is an early version of the reference clock over connection 78. These signals are supplied from the bus clock DLL (FIG. 1) and will be described in greater detail with respect to FIGS. 4 and 5.

It should be understood that the reference clock signal provided over connection 24 may include some error, in the form of clock jitter. This clock jitter can be either positive or negative, and will be described in more detail with respect to FIGS. 3A and 3B. More importantly, however, is that any error on the reference clock signal 24 may be manifested in one, or more, phases established by the quadrature outputs 53a, 53b, 53c or 53d. One of the features of the present invention is the ability to take that error present on the reference clock signal 24 and average it over more than one phase, such that no phase contains all of the error. Alternatively, the reference clock itself may be error free and jitter appearing on one of the other clock outputs may result in error on X[3]. The present invention is useful for averaging error in any output, which is substantially equal to the reference clock signal over at least two phases. That is to say that error present on the reference clock signal or error present on X[3] due to any quadrature (in this particular embodiment) output may be averaged over at least two phases. The outputs of delay lines 47a, 47b, 47c and 47d are then supplied to edge averaging circuit 100. In this embodiment, edge averaging circuit 100 includes a plurality of output buffers 100a, 100b, 100c and 100d, each having a delay of td (to be described in detail with reference to FIG. 3A). Output buffers 100a–100d provide the quadrature output signals OUT[0], OUT[1], OUT[2] and OUT[3], over connections 26a–26d, respectively, the output signals being a representation of the signals on connections 53a–53d, respectively, but with any error in the reference clock 24 or 53d being averaged over at least two phases.

Figure 3A:
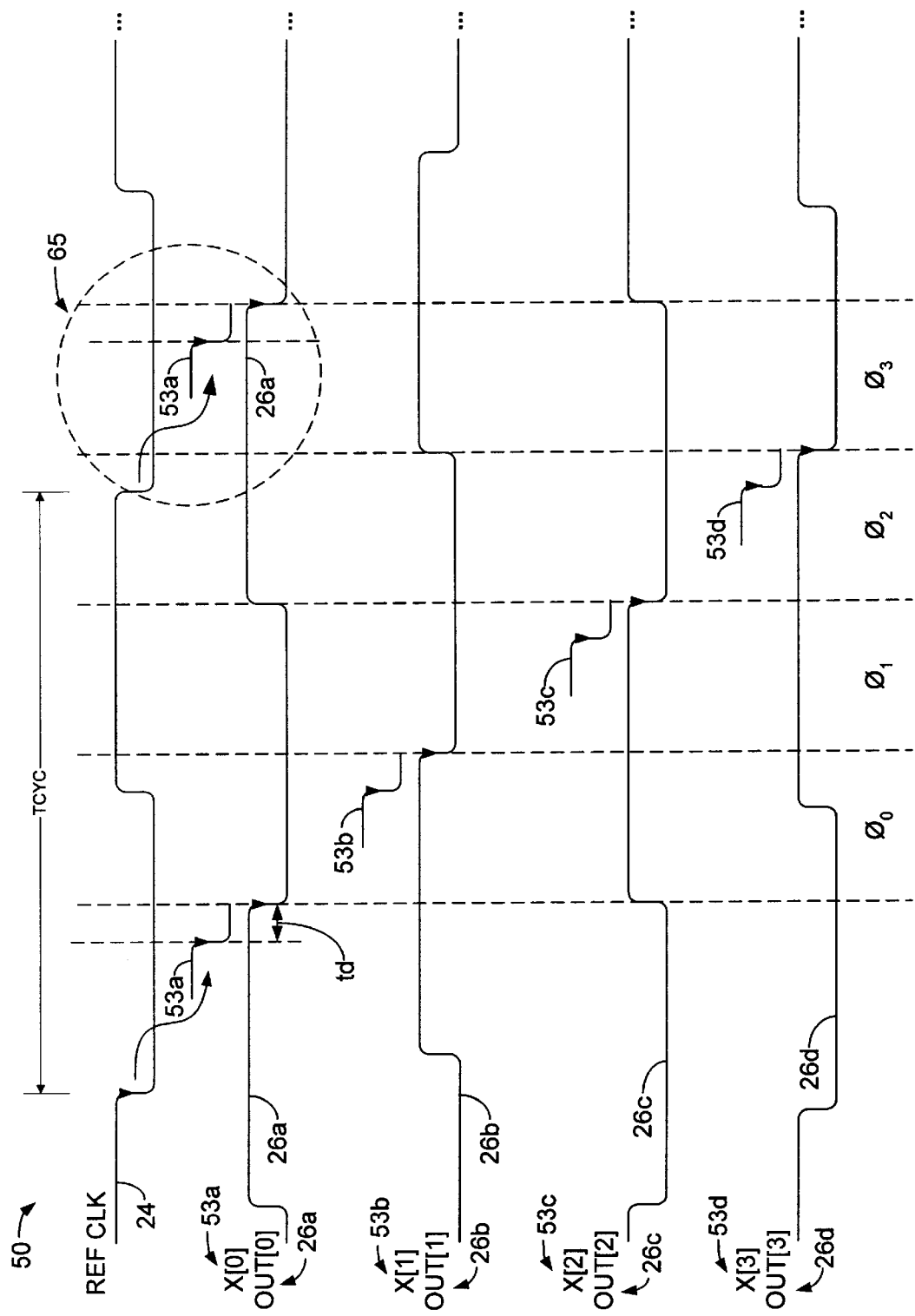
FIG. 3A is a graphical representation illustrating the reference clock and quadrature clock signals of FIG. 2.

FIG. 3A is a graphical representation 50 illustrating the reference clock 24 and quadrature clock signals 53 of FIG. 2. As can be seen, reference clock signal 24 has a cycle equal to a time period $T_{CYC}$. This cycle includes a falling edge, a rising edge and another falling edge of reference clock signal 24. Input X[0] 53a is shown as being derived from reference clock signal 24, with output OUT[0] 26a being shown as having a delay of duration td with respect to input X[0] 53a. Delay td is the time period over which the signal on connection 53a is delayed through output buffer 100a resulting in the output on connection 26a. As shown in FIG. 3A, the delay td is measured as the difference between the falling edge of signal 53a and the falling edge of the signal 26a. Similarly, the signal on connection 53b is delayed by td through output buffer 100b resulting in output signal OUT[1] 26b, input X[2] 53c is delayed through output buffer 100c resulting in output OUT[2] on connection 26c, and input X[3] on connection 53d is delayed through output buffer 100d by td resulting in output OUT[3] on connection 26d.

When the strobe clock DLL 25 is locked, and under ideal conditions, the delay between the falling edges of signals X[i] and X[(i+1) mod 4] is $\emptyset=\frac{1}{4}(T_{CYC})$. If output buffers $B_0$–$B_3$ are simple matched output buffers of delay td, then $\emptyset_0=\emptyset_1=\emptyset_2=\emptyset_3=\emptyset$ as desired. If, however, the reference clock signal 24 experiences a jitter of $-\Delta$ (or $+\Delta$), as illustrated by the signals 24, 53*a* and 26*a* shown by reference numeral 65, then $\emptyset_0=\emptyset_1=\emptyset_2=\emptyset$, while $\emptyset_3=\emptyset-\Delta$ as will be illustrated in FIG. 3B.

Referring now to FIG. 3B, shown is a graphical representation of reference clock signal 24, represented by signal 53*a* as passed through delay line 47*a* of FIG. 2, in which error is present in the form of a negative jitter. Signal 55 represents signal 53*a* with a negative $\Delta$ jitter applied thereto. Signal 55 illustrates the situation in which signal 53*a* occurs $\Delta$ earlier and takes the form of signal 55, which includes $-\Delta$ jitter. Similarly, the $\Delta$ may be a positive value in which the signal containing jitter would occur after signal 53*a*. In this manner, all of the jitter associated with signal 55 is transferred to one edge of one of the quadrature clock outputs 53*a*–53*d*, thus resulting in all of the error occurring across one phase as established by clock outputs 53*d* and 53*a*.

Figure 4:
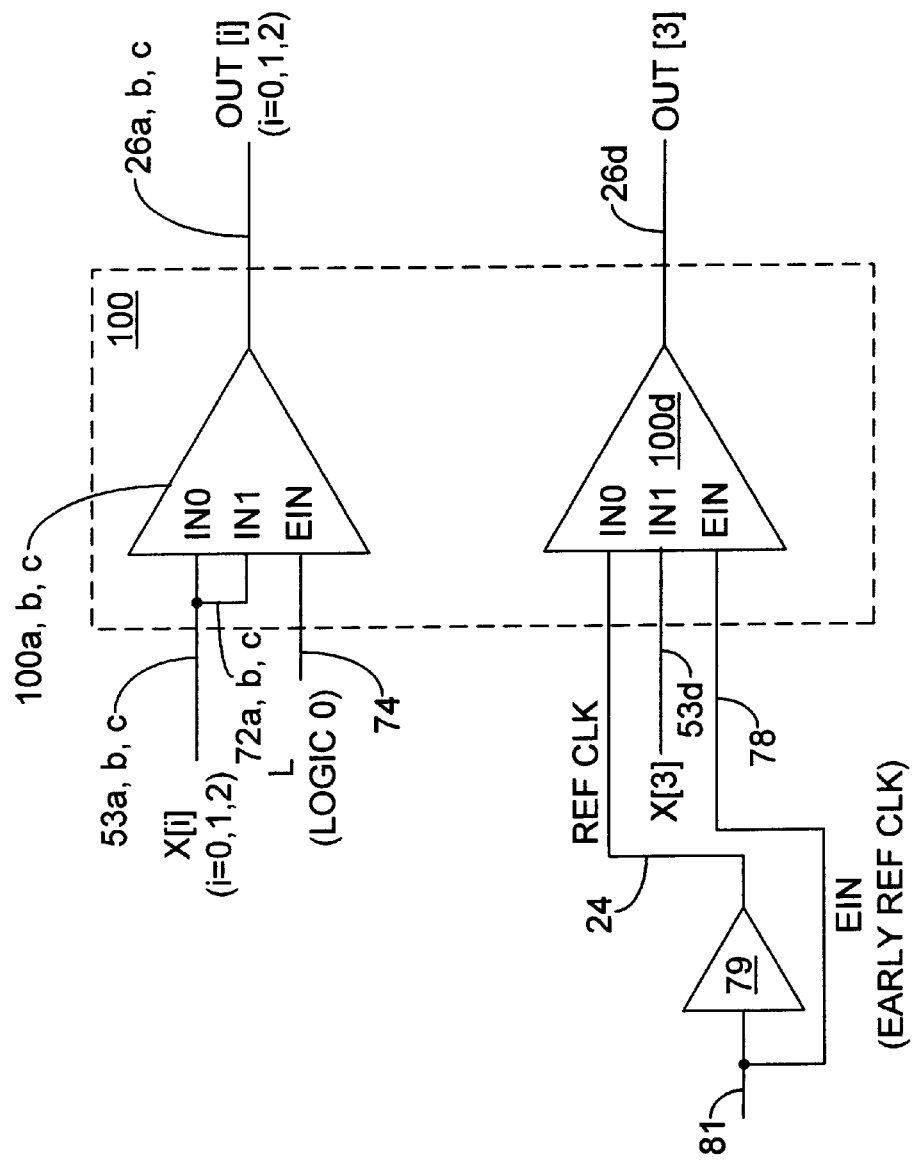
FIG. 4 is a schematic representation of the edge averaging circuit of the present invention.

FIG. 4 is a schematic representation of the edge averaging circuit 100 of the present invention. As can be seen, output buffers 100*a*, 100*b* and 100*c* of FIG. 2 are represented by a single three input device. Device 100*a*, 100*b*, 100*c* receives at input IN0 signals X[0], X[1] and X[2] over connections 53*a*, 53*b* and 53*c*, respectively. Device 100*a*, 100*b*, 100*c* receives at input IN1 over connections 72*a*, 72*b* and 72*c* signals 53*a*, 53*b* and 53*c*, respectively. Input IN1 refers to a secondary clock input, which in this case is the same as the reference clock signal through delay lines 47*a*, 47*b* and 47*c* represented by signals 53*a*, 53*b* and 53*c*, respectively. At input EIN, device 100*a*, 100*b*, 100*c* receives a logic 0, or logic low, input over connection 74. Input EIN is an early version of the reference clock signal IN0.

In accordance with one aspect of the invention, output buffer 100*d* is configured to receive the reference clock signal 24 into its IN0 input, the X[3] delay line output over connection 53*d* into its IN1 input and an early reference clock signal 78 in its EIN input. As can be seen, the reference clock signal 24 is passed through buffer 79 while the early reference clock signal 78 is applied to output buffer 100*d* with no delay applied thereto. In this manner, both the reference clock, the early version of the reference clock and the signal on line 53*d*, containing all of the error in this embodiment, are applied to output buffer 100*d*. Given the jitter of $-\Delta$ on the reference clock 24 (falling edge) illustrated in FIG. 3B, the circuit in FIG. 4 results in:

td=td$_n$ for X[i](falling edge) which corresponds to OUT[i](falling edge) for i=0,1,2 td=td$_n-\Delta/2$ for X[i](falling edge) which leads to OUT[i] (falling edge) for i=3. The phase times are now $\emptyset_0=\emptyset_1=\emptyset$ and $\emptyset_2=\emptyset_3=\emptyset-\Delta/2$, where the new maximum phase error ($\Delta/2$) is significantly less than the original ($\Delta$).

Figure 5:
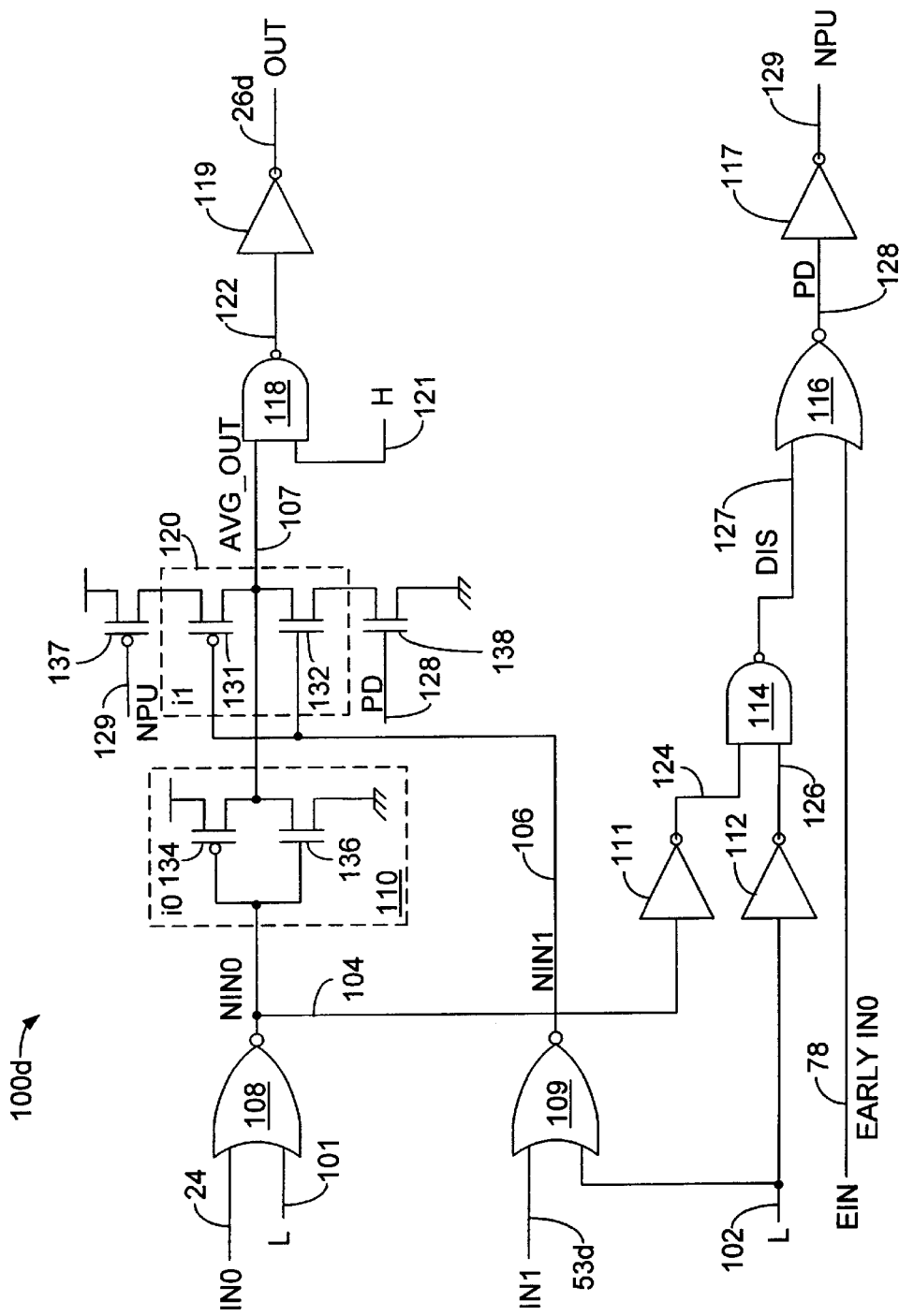
FIG. 5 is a schematic view illustrating the edge averaging output buffer of FIG. 4.

FIG. 5 is a schematic view illustrating the edge averaging output buffer 100*d* of FIG. 4. The reference clock signal IN0 is supplied to NOR gate 108 over connection 24. Also supplied to NOR gate 108 over connection 101 is a logic low signal. NOR gate 108 supplies the inverse of the IN0 signal as output NIN0 on connection 104. NOR gate 109 receives as input the IN1 signal, which in this embodiment is the X[3] input signal, over connection 53*d* and also receives a logic low input over connection 102. NOR gate 109 supplies the inverse of the IN1 signal (secondary clock input NIN1) over connection 106. The inverse reference clock signal on connection 104 is supplied to buffer 111 and the logic low on connection 102 is supplied to buffer 112. Buffer 111 and buffer 112 supply the input to NAND gate 114 over connections 124 and 126, respectively. The output of NAND gate 114 on connection 127 is the DIS signal. The rising edge of signal DIS as caused by the falling edge of signal IN0, disables drive fight between inverters 110 and 120. The DIS signal on connection 127 is supplied to NOR gate 116 along with an early version of the IN0 (reference clock signal EIN) over connection 78. The output of NOR gate 116 on connection 128 is the PD signal, which is supplied as input to inverter 117, which supplies the inverse signal NPU on connection 129. The signals PD and NPU are derived from signals IN0 and EIN, respectively.

In accordance with the invention, inverters 110 and 120 receive as input the inverse reference clock signal NIN0 over connection 104 and the inverse secondary clock input signal NIN1 over connection 106, respectively. Inverter 110 includes transistors 134 and 136 and inverter 120 includes transistors 131 and 132. Preferably, the transistors described herein are complementary metal oxide semiconductor (CMOS) field effect transistors (FET's). Also connected to transistor 131 is transistor 137, which receives as input the NPU signal over connection 129. Similarly connected to transistor 132 is transistor 138, which receives as input the PD signal over connection 128. Inverters 110 and 120 are configured so that they engage in a drive fight in order to supply the average output over connection 107. Inverters 110 and 120 drive fight each other during a definable window of time. A falling edge of signal EIN results in the "edge averaging" being turned on shortly before the reference clock signal on connection 24 propagates into output buffer 100*d*, and then being turned off some short time after the falling edge of signal IN0. The turn-on and turn-off delays are determined by the gate delays of the particular implementation, and may be varied from that illustrated herein by those skilled in the art.

The definable time period described above is particularly valuable in a situation in which the reference clock signal 24 is not aligned with delay line output 53*d*, as opposed to a near-ideal operating condition in which the reference clock signal 24 is aligned with delay line output 53*d*. The definable time period is particularly useful here because, in addition to enabling the intended edge averaging to take place, it also prevents the combining circuitry (inverters 110 and 120) from drive-fighting for relatively long periods of time during irregular situations. Irregular situations include test modes, or just after DLL reset, where edge averaging is enabled but where X[3] is not aligned with the reference clock. The average output over connection 107 and a logic high on connection 121 are supplied to NAND gate 118, which supplies its output over connection 122 to buffer 119, which supplies the output signal OUT[3] over connection 26*d* as shown in FIG. 4. While the embodiment described with respect to FIG. 5 indicates input X[3] being combined with reference clock 24, it should be understood that any DLL output which is substantially equal to the reference clock signal may be combined with the reference clock signal to achieve similar results.

The circuit described with respect to FIG. 5 reduces output clock phase error compared to that possible with simple matched output buffers. Generally, the circuit in FIG. 5 allows inverters 110 and 120 to drive fight at node 107 within a small window of time centered about the falling edge of signal IN0. The effect is an IN0 falling edge to OUT falling edge propagation delay which depends on the relative arrival times of signals IN0 falling edge and IN1 falling edge. More specifically, let:

t(IN0 falling edge)≡time at which IN0 falling edge occurs t(IN1 falling edge)≡time at which IN1 falling edge occurs $td_n$≡IN0 falling edge to OUT falling edge propagation delay when t(IN1 falling edge)=t(IN0 falling edge)

then:

td≡IN0 falling edge to OUT falling edge propagation delay td≈$td_n$+(t(IN1 falling edge)−t(IN0 falling edge))/2.

Figure 6:
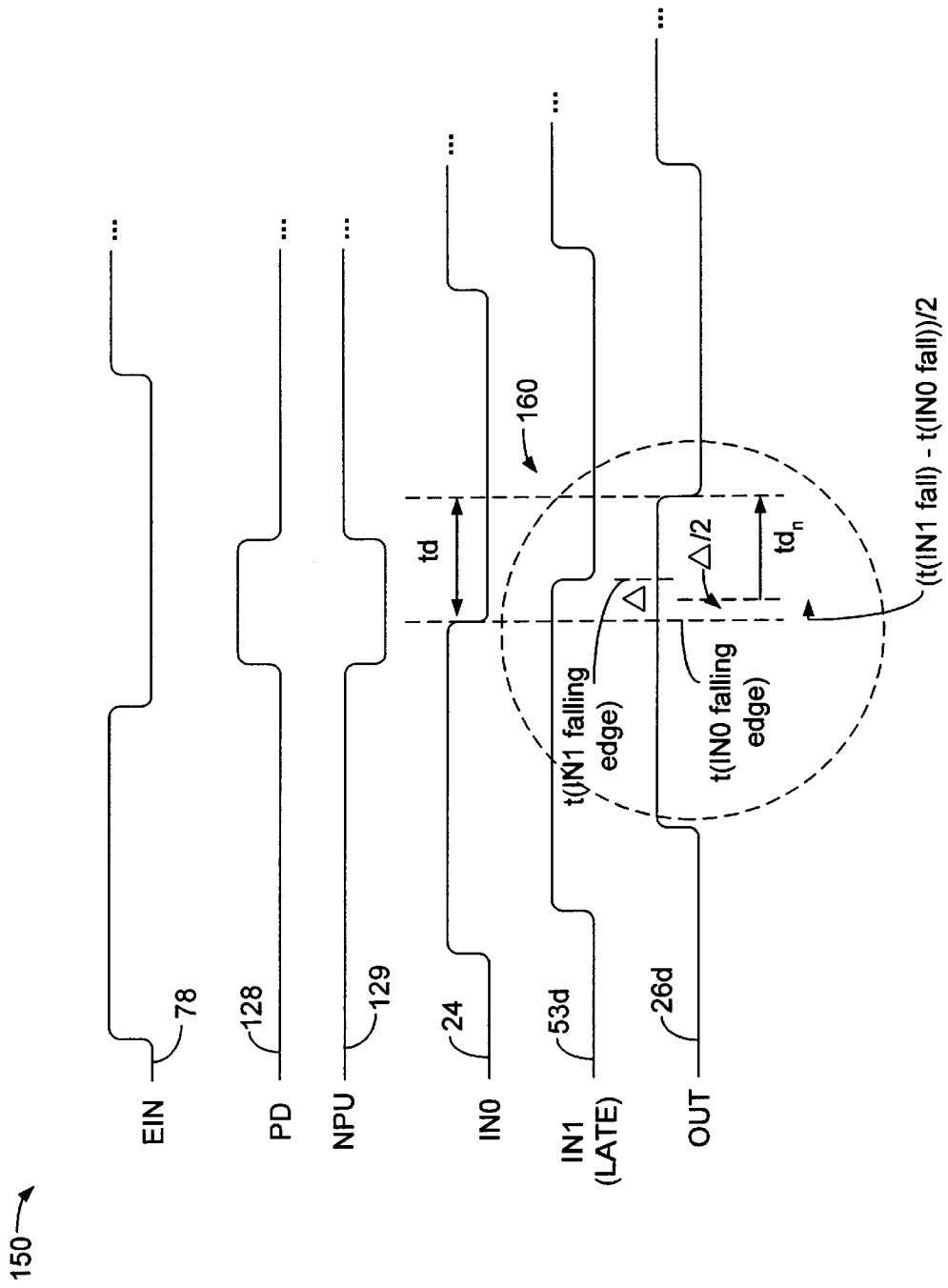
FIG. 6 is a graphical representation of the results achieved through operation of the edge averaging circuit shown in FIG. 5.

FIG. 6 is a graphical representation 150 of the results achieved through operation of the edge averaging circuit 100d shown in FIG. 5. The first trace illustrated is that of the early version of the reference clock signal EIN applied to NOR gate 116 on connection 78. Next shown are the PD and NPU signals on connections 128 and 129, respectively. As can be seen, the NPU signal on connection 129 is opposite that of the PD signal on connection 128. The reference clock signal IN0 is shown as trace 24. The secondary clock input signal IN1 represented as signal 53d is shown as having a falling edge that is delayed by the amount Δ, which is the delay of t(IN1 falling edge) past the falling edge of reference clock signal IN0 24. The output signal 26d is shown as having a falling edge that occurs at a time period td after the falling edge of the reference clock signal IN0 24. The falling edge of signal IN1 53d occurs at a time period Δ after the falling edge of signal IN0. As can be seen, the total time delay between output signal 26d and reference clock signal IN0 24 is represented by td, while the time delay $td_n$, represents the total time delay td minus (Δ) divided by 2, which represents (t(IN1 falling edge)−t(IN0 falling edge))/2.

As stated above, the falling edge of signal EIN 78 results in the edge averaging being turned on (as evidenced by signals PD 128 and NPU 129) shortly before the reference clock signal IN0 24 propagates into the combining circuitry (inverters 110 and 120), and then being turned off shortly thereafter (as evidenced by PD and NPU switching after the falling edge of the input signal IN0 24.

Figure 7:
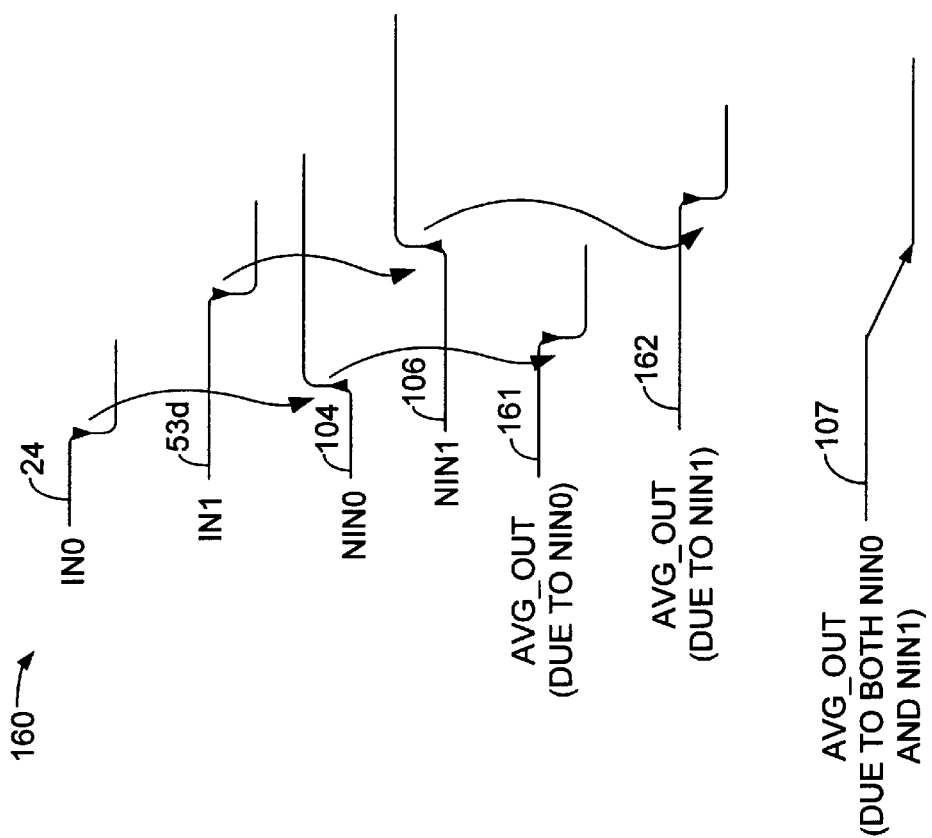
FIG. 7 is a detailed view illustrating the relationship between the signals described with respect to FIG. 6.

FIG. 7 is a detailed schematic view illustrating the relationship between the signals described with respect to FIG. 6. As shown in FIG. 7, the reference clock input IN0 24 and the secondary clock input IN1 53d are represented by their inverse values 104 (NIN0) and signal 106 (NIN1), respectively. As can be seen, trace 161 illustrates the average output due to the signal NIN0 104 and trace 162 represents the average output due to NIN1 signal 106. Trace 107, which corresponds to the average output node 107 in FIG. 5, represents the average output due to both NIN0 104 and NIN1 106. This illustrates that the average output due to NIN0 and NIN1 are combined, resulting in error being averaged over at least two clock phases.

It will be apparent to those skilled in the art that many modifications and variations may be made to the preferred embodiments of the present invention, as set forth above, without departing substantially from the principles of the present invention. For example, the present invention can be used to reduce error present in any clock signal substantially equal to a reference clock signal. All such modifications and variations are intended to be included herein within the scope of the present invention, as defined in the claims that follow.

What is claimed is:

1. A system for clocking in an integrated circuit, comprising:

a delay locked loop (DLL) having a plurality of delay lines, each delay line having an output, each output establishing a boundary between two consecutive phases;

a reference signal supplying an input to said DLL, said reference signal being substantially equal to at least one of said plurality of delay line outputs; and buffer circuitry, having a plurality of inputs corresponding to said plurality of delay line outputs, said buffer circuitry also having a plurality of outputs, each output establishing said boundary between two consecutive phases, said buffer circuitry configured to combine at least one of said plurality of delay line outputs with said reference signal such that error is averaged across at least two of said phases established by said plurality of buffer circuitry outputs.

2. The system of claim 1, wherein said combining circuitry further comprises two inverters having a common output, said two inverters configured to engage in a drive fight during a definable time period.

3. The system of claim 1, wherein said definable time period includes a time period defined by the operation of an early representation of said reference signal and said reference signal.

4. The system of claim 1, wherein said DLL produces a quadrature clock output.

5. The system of claim 1, wherein said error is present in said reference signal.

6. The system of claim 1, wherein said error is present in at least one of said plurality of delay line outputs.

7. A method for clocking in a delay locked loop (DLL), said DLL including a plurality of delay lines, each delay line having an output, each output establishing a boundary between two consecutive phases, the method comprising the steps of:

receiving in said DDL a reference signal;

supplying each of said plurality of delay line outputs to a corresponding input of buffering circuitry, said buffering circuitry also having a plurality of outputs, each output establishing said boundary between two consecutive phases; and combining in said buffering circuitry said reference signal and at least one of said plurality of delay line outputs, whereby error is averaged over at least two of said phases established by said buffering circuitry outputs.

8. The method of claim 7, wherein said DLL produces a quadrature clock output.

9. The method of claim 7, wherein said error is present in said reference signal.

10. The method of claim 7, wherein said error is present in at least one of said plurality of delay line outputs.

11. The method of claim 7, wherein said at least one of said plurality of delay line outputs is substantially equal said reference signal.

12. The method of claim 7, wherein said combining step further includes the step of operating, during a definable time period, two inverters having a common output, said two inverters configured to drive fight each other during a definable time period.

13. The method of claim 7, further comprising the step of using an early version of said reference signal and said reference signal to establish a definable time period.

14. A method for reducing error in a delay locked loop (DLL), said DLL having a plurality of delay lines, each delay line having an output, each output establishing a boundary between two consecutive phases, each output supplied to a corresponding input of buffering circuitry, said buffering circuitry also having a plurality of outputs, each output establishing said boundary between two consecutive phases, the method comprising the step of averaging an error that is represented in one of said plurality of delay line outputs, which is substantially equal to said reference signal over at least two of said phases established by said plurality of outputs of said buffering circuitry by combining, in said buffering circuitry, a reference signal with one of said delay line outputs.

15. The method of claim 14, wherein said DLL produces a quadrature clock output.

16. The method of claim 14, wherein said error is present in said reference signal.

17. The method of claim 14, wherein said error is present in at least one of said plurality of DLL outputs.

18. The method of claim 14, wherein said averaging step further includes the step of operating, during a definable time period, two inverters having a common output, said two inverters configured to drive fight each other during a definable time period.

19. The method of claim 14, further comprising the step of using an early version of said reference signal and said reference signal to establish a definable time period.

* * * * *